(12) United States Patent
Warren et al.

(10) Patent No.: US 6,883,047 B2
(45) Date of Patent: Apr. 19, 2005

(54) CONCURRENT ASYNCHRONOUS USB DATA STREAM DESTUFFER WITH VARIABLE WIDTH BIT-WISE MEMORY CONTROLLER

(75) Inventors: Dean Warren, Carlton, OR (US); Jonathan C. Lueker, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 263 days.

(21) Appl. No.: 09/866,150

(22) Filed: May 25, 2001

(65) Prior Publication Data

US 2003/0063018 A1 Apr. 3, 2003

(51) Int. Cl.[7] .............................................. G06F 13/14
(52) U.S. Cl. .................... 710/67; 375/240.25; 375/267; 710/52; 710/33
(58) Field of Search ............................ 710/65, 33, 52; 375/240.25, 267

(56) References Cited

U.S. PATENT DOCUMENTS 6,292,516 B1 * 9/2001 Petsko et al. ................ 375/267
6,522,694 B1 * 2/2003 Ryan ...................... 375/240.25

\* cited by examiner

*Primary Examiner*—A. Elamin
(74) *Attorney, Agent, or Firm*—Schwegman, Lundberg, Woessner & Kluth, P.A.

(57) ABSTRACT

A concurrent asynchronous USB 2.0 data stream destuffer and separator with variable-width bit-wise memory controller is described. A parallel stream bit destuffer module identifies in parallel one or more stuffed bits in a decoded data field of a received data stream using a six-bit sliding window. The stuffed bits are bits that were inserted into the received USB data stream by a transmitter to force data transitions in the received USB data stream. A data separator module separates the one or more stuffed bits from a plurality of valid data bits in the decoded data field. A memory module generates an incremental pointer value representative of the number of valid bits and writes the plurality of valid data bits from the decoded data field into a variable sized bit-wise memory structure.

25 Claims, 8 Drawing Sheets

CONCURRENT ASYNCHRONOUS USB DATA STREAM DESTUFFER WITH VARIABLE WIDTH BIT-WISE MEMORY CONTROLLER

FIELD OF THE INVENTION

The present invention relates generally to computer systems and more specifically to the operation of a universal serial bus in a computer system.

BACKGROUND OF THE INVENTION

Data communications is the transmission of data from one computer or device to another. A Universal Serial Bus is an interface for data communications between a computer and external peripheral devices. A Universal Serial Bus follows a data communications protocol defined in the Universal Serial Bus (USB) Specification, Version 1.1. USB Specification version 1.1 supports two different rates for transmitting data: 1.5 Mega bits (Mbits) per second for low-speed devices and 12 Mbits/second for high-speed devices. Recently a USB Specification Version 2.0 was made available. USB Specification 2.0 extends the rate for transferring data from 12 Mbps on USB 1.1 up to 480 Mbps on USB 2.0.

In some digital data communication arrangements, transmitted serial bit streams must contain periodic logic level transitions that provide frequency information to a receiver. The frequency information is used for the purpose of locking onto the received data. It is not unusual to add (or "stuff") one extra bit of information into a transmitted bit stream to force a transition when a transition has not occurred within a maximum amount of time that a receiver can be allowed to drift off frequency. It is also not unusual for the incoming serial bit stream to be converted by a receiver, such as the receiver described in "Data Recovery Method And Apparatus," U.S. patent application Ser. No. 09/670,598 filed on Sep. 29, 2000, to a parallel nine-bit data field that may contain as many as two stuffed bits that must be discarded. In particular, a USB 2.0 transmitting device transmits digital bits over a USB cable using NonReturn-to-Zero Inverted ("NRZI") encoding techniques. In order to ensure adequate signal transitions, bit stuffing is employed by the USB 2.0 transmitting device. A zero is inserted after every six consecutive ones in the data stream before the data is NRZI encoded, to force a transition in the NRZI data stream. A USB 2.0 receiving device, such as the one described in "Data Recovery Method And Apparatus," U.S. patent application Ser. No. 09/670,598 filed on Sep. 29, 2000, receives USB 2.0 serial data from a USB wire as a nine-bit parallel data field that may contain up to two previously stuffed data bits. The stuffed data bits do not represent valid data bits and therefore must be discarded. However, the USB 2.0 receiving device does not have a mechanism to identify or discard the stuffed data bits. A method is needed to identify and remove one or two stuffed bits from a received nine-bit parallel data bus.

It is also common in a digital data communication arrangement such as the one described above, to remove prior stuffed bits by creating a nine-bit mask where each mask bit can be used to indicate the validity of each bit in the corresponding data field. This is accomplished by setting to a logic zero (or in an alternate embodiment a logic one) the positions within the mask that correspond to the bits to be discarded in the nine-bit data field. When the mask indicates that one or more bits in the corresponding nine-bit data field are invalid, the nine-bit data field must be decimated to the exact number of valid bits contained within the nine-bit data field. Another problem encountered in digital communications when using USB in particular occurs when a received nine-bit data field contains invalid bits that are indicated as such by using a corresponding mask, as described above. Before the decoded data field can be written to memory, the invalid bits must be removed by decimating the data. What is needed is a technique that removes the invalid bits, compresses the remaining bits into the lowest possible locations of the data field and then creates a new field that indicates the number of bits that are valid within this field.

It is also common in some digital data communication arrangements such as the one described above, to write the destuffed, decimated, incoming seven-, eight-or nine-bit, parallel data into a bit-wise memory controller that will temporarily store the data in a memory buffer until the number of buffered bits of information are equal to the mean number of bits that were sent during a time interval previously agreed upon by the communication system designers. Another problem encountered in digital communications using USB occurs when a received nine-bit data field has been decimated using the technique described above and must be written into memory for storage until enough data bits have been accumulated for delivery to upstream functions for use. What is needed is a method to write incoming, parallel, seven-, eight-or nine-bit data into a bit-wise memory controller that stores the data until eight bits have accumulated.

Thus, the current USB 2.0 macrocell analog front end (AFE) and data recovery (DR) block produce a nine-bit data stream that must be converted to an eight-bit stream at the USB 2.0 peripheral packet interface. Furthermore, the nine-bit data stream includes stuffed bits that must be removed implying that as few as few as seven data bits could be valid after destuffing. Therefore, there is a need for an improved method of destuffing and decimating an incoming data stream.

DESCRIPTION OF THE EMBODIMENTS

A novel concurrent asynchronous USB 2.0 data stream destuffer and separator with variable width bit-wise memory controller are described. In the following detailed description of the embodiments, reference is made to the accompanying drawings, which form a part hereof, and in which is shown by way of illustration specific embodiments in which the invention may be practiced. These embodiments are described in sufficient detail to enable those skilled in the art to practice the invention, and it is to be understood that other embodiments may be utilized and that structural, logical and electrical changes may be made without departing from the spirit and scope of the present invention. The following detailed description is, therefore, not to be taken in a limiting sense, and the scope of the present invention is defined only by the appended claims.

Figure 1:
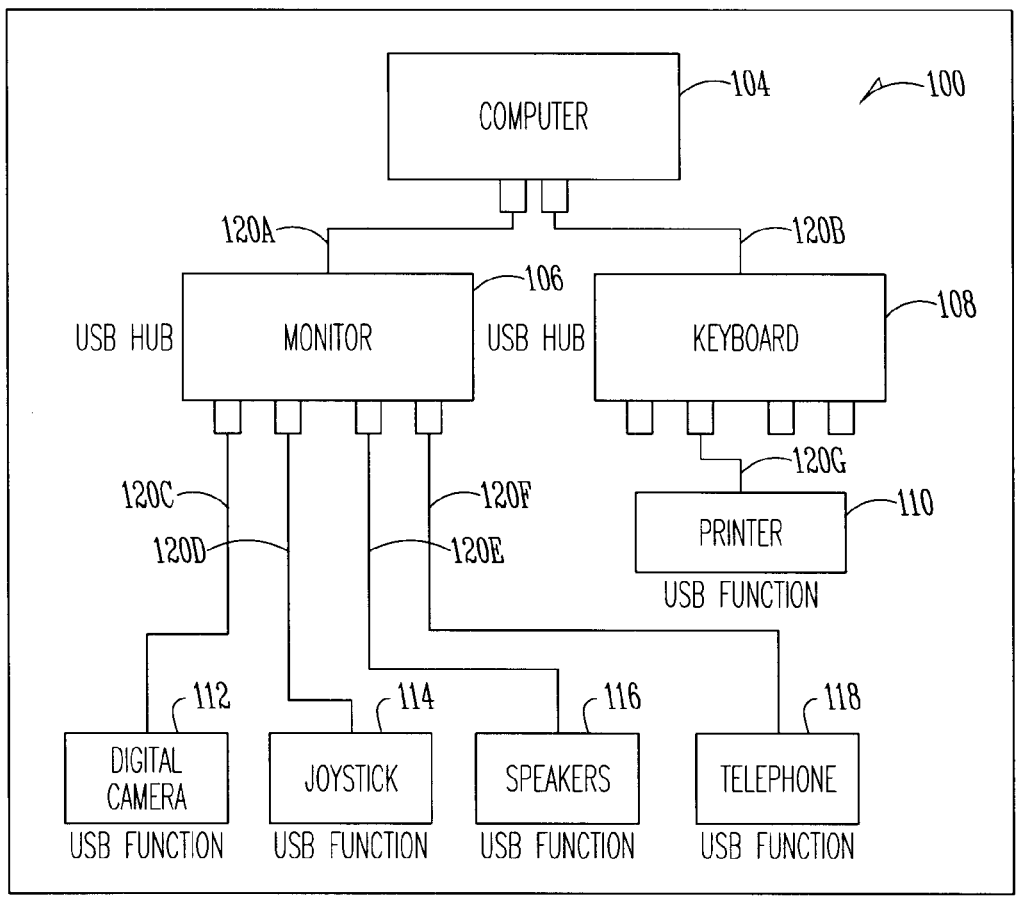
FIG. 1 is a diagram of an example USB-based computer system.

FIG. 1 is a diagram of an example USB-based computer system 100 in which example embodiments of the present invention are used. The computer system of FIG. 1 comprises a USB host controller, such as computer 104, attached to one or more hubs 106, 108. One or more USB devices 110, 112, 114, 116, 118 are connected to the hubs 106, 108. The computer 104, hubs 106, 108 and USB devices 106, 108, 110, 112, 114, 116, 118 are communicatively coupled with USB cables 120A–120G. The computer 104 runs software to manage the USB hubs and devices. Example functions of the software include managing dynamic attachment/detachment of hubs and devices as well as power management. The computer system 100 comprises two hubs 106, 108. In the example shown in FIG. 1, the hubs 106, 108 are multi-port hubs incorporated in USB devices (a monitor 106 and a keyboard 108). In alternate embodiments, the hubs are stand-alone devices. The hubs 106, 108 provide connectivity for additional USB devices 110, 112, 114, 116, 118. In the example shown in FIG. 1, the USB devices include a printer 110, a digital camera 112, a joystick 114, speakers 116 and a telephone 118. The USB devices 110, 112, 114, 116, 118 react to the transactions sent by the host controller (computer 104). As shown in FIG. 1, the USB-based computer system 100 is set up in a tiered topology with a host controller 104 on the top tier and USB hubs 106, 108 and devices (also referred to as functions) 110, 112, 114, 116, 118 on subsequent tiers. It is important to note that USB devices incorporating embodiments of the invention are not limited to the example devices shown in FIG. 1. Embodiments of the present invention are intended for use with any peripheral device, available now or in the future, that uses a USB data communications protocol.

Figure 2:
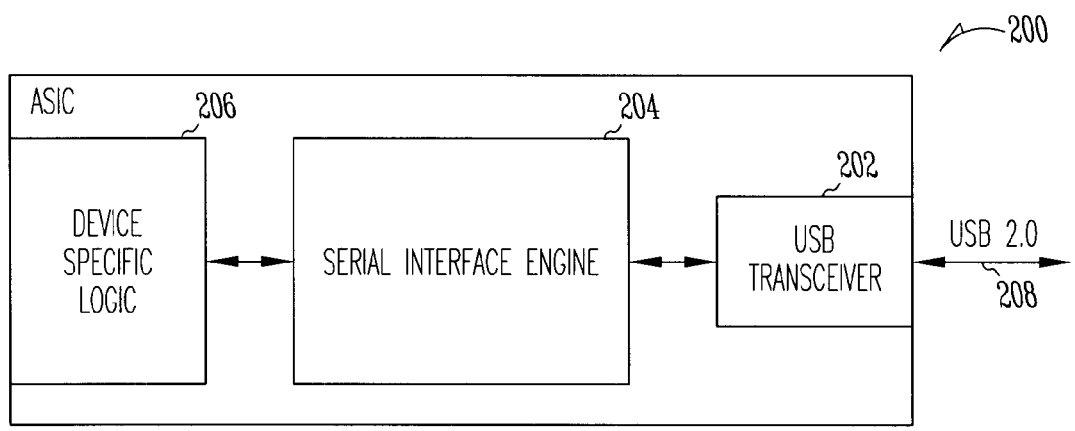
FIG. 2 is a high-level block diagram of an Application Specific Integrated Circuit (ASIC) for an example USB device such as the example USB devices shown in FIG. 1.

FIG. 2 is a high-level block diagram of an Application Specific Integrated Circuit (ASIC) 200 for a USB device such as the example USB devices 106, 108, 110, 112, 114, 116, 118 shown in FIG. 1. As shown in FIG. 2, the ASIC 200 comprises a USB transceiver 202, a serial interface engine 204 and device-specific logic 206. A USB device can serve as a function by providing an interface for a peripheral. A USB device can serve as a hub by providing USB ports for additional peripherals. Each USB device, whether the USB device is a hub or a function, has a serial interface engine (SIE) 204. The SIE 204 provides an interface between device-specific logic 206 for the hub or function and a transceiver 202 that transmits or receives signals across a serial communications line 208.

Figure 3:
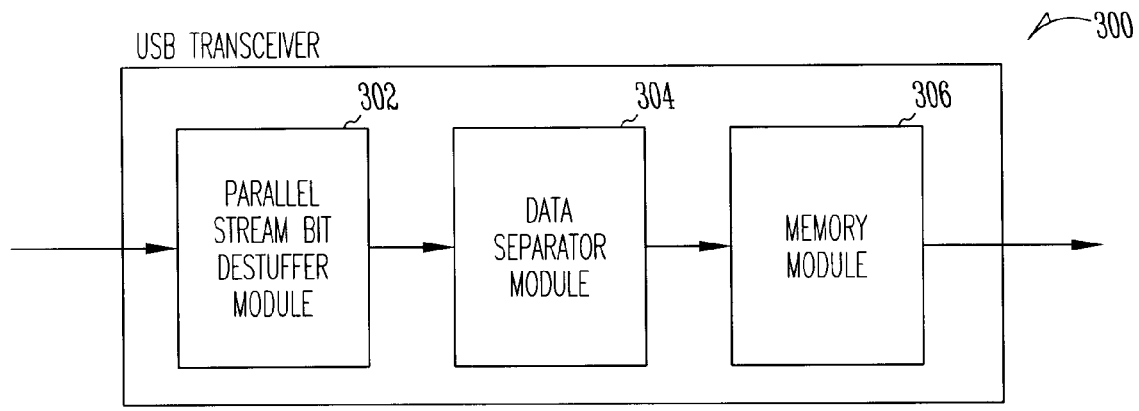
FIG. 3 is a high-level block diagram of a novel USB transceiver, such as the USB transceiver shown in FIG. 2, according to one embodiment of the invention.

FIG. 3 is a high-level block diagram of a novel USB transceiver 300, such as the USB transceiver 202 of FIG. 2, according to one embodiment of the invention. In one embodiment, the USB transceiver 300 follows a protocol defined in version 2.0 of the USB specification. The USB transceiver 300 comprises a parallel stream bit destuffer module 302, a data separator module 304, and a memory module 306.

Before the parallel stream bit destuffer module 302 examines a received USB data stream, the received USB data stream is parsed and decoded by USB transceiver logic that is not shown in FIG. 3. A novel apparatus and method of parsing and decoding USB data stream is described in detail in U.S. patent application Ser. No. 10/041,848, entitled "Pipelined, Universal Serial Bus Parallel Frame Delineator and NRZI Decoder" which is assigned to the assignee of the present invention.

The parallel stream bit destuffer module 302 identifies in parallel one or more stuffed bits in a decoded data field of a received data stream using a six-bit sliding window. The stuffed bits are bits that were inserted into the received USB data stream by a transmitter to force data transitions in the received USB data stream. The parallel stream bit destuffer module 302 is described in more detail by reference to FIGS. 4A and 4B below. The data separator module 304 separates the one or more stuffed bits from a plurality of valid data bits in the decoded data field. The data separator module 304 is described in more detail by reference to FIGS. 5A and 5B below. The memory module 306 generates an incremental pointer value representative of the number of valid bits and writes the plurality of valid data bits from the decoded data field into a variable sized bit-wise memory structure. After at least eight bits of USB data have been written to the memory structure, the peripheral side of the interface reads a byte from the memory. The memory module is described in more detail by reference to FIGS. 6A and 6B. The operation of the USB transceiver 300 is further described by reference to a data flow example shown in FIG. 7.

Identifying Stuffed Bits

After a received USB 2.0 data stream has been parsed and decoded, the received USB data stream is examined to identify stuffed bits in the data stream. A "stuffed bit" is a bit that was inserted into a data stream by a transmitter to force a data transition.

Figure 4A:
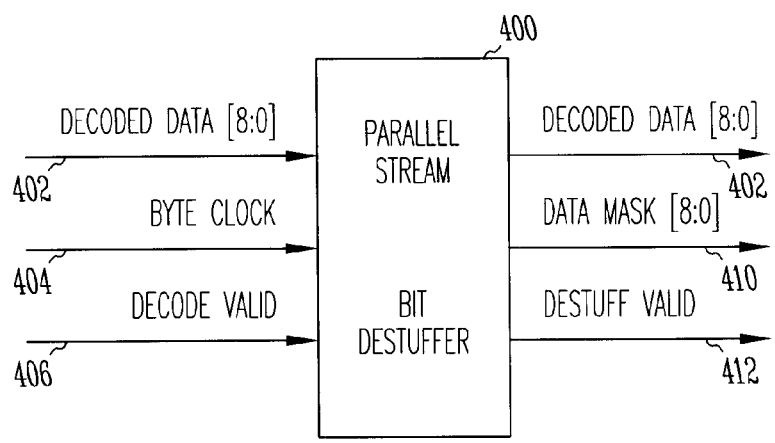
FIG. 4A is a block diagram of an example embodiment of the parallel stream bit destuffer module of the transceiver shown in FIG. 3.

FIG. 4A is a block diagram of an example embodiment of a parallel stream bit destuffer module 400 (also referred to as "the destuffer module") of the USB transceiver shown in FIG. 3. The inputs to the parallel stream bit destuffer module 400 comprise a nine-bit field of decoded data 402 (also referred to as "the decoded data field"), a byte clock signal 404 and a decode valid signal 406. The outputs of the parallel stream bit destuffer module 400 comprise the nine-bit field of decoded data 402, a nine-bit data mask 410 and a destuff valid signal 412.

In one embodiment, the destuffer module 400 of FIG. 4A performs a method of identifying in parallel one or more stuffed bits in a decoded data field of a received data stream using a six-bit sliding window. A "received data stream" is a data stream received by a USB transceiver. A "decoded data field" is a field of data in the received data stream. In an example embodiment, a decoded data field comprises nine bits of decoded data. A "six-bit sliding window" for a bit in the decoded data field includes the six consecutive bits immediately preceding the bit in the received data stream. For example, a six-bit sliding window for a first bit in the decoded data field includes six consecutive bits immediately preceding the first bit in the received data stream. The six consecutive bits can comprise bits from one or two decoded data fields. For example, if the six-bit sliding window is for one of the final three bits received of a nine-bit decoded data field, then the six consecutive bits immediately preceding one of the final three bits received are in the same nine-bit decoded data field. However, if the six-bit sliding window is for one of the initial six bits received of a nine-bit decoded data field, then the six consecutive bits immediately preceding the one of the first six bits are not all in the same nine-bit decoded data field. In this case, one or more of the bits in the six-bit sliding window will be in the prior nine-bit decoded data field.

The act of identifying one or more stuffed bits comprises examining the first bit in the decoded data field and the six-bit sliding window for the first bit. If the six-bit sliding window indicates that the first bit is a stuffed bit, then a first corresponding bit in a data mask is set. The data mask is also simply referred to as the mask.

The act of identifying one or more stuffed bits further comprises examining a second bit in the decoded data field and a six-bit sliding window for the second bit. A six-bit sliding window for the second bit in the decoded data field includes six consecutive bits immediately preceding the second bit in the received data stream. Thus, a six-bit sliding window for the first bit is not the same as the six-bit sliding window for the second bit. If the six-bit sliding window for the second bit indicates that the second bit is a stuffed bit, then a second corresponding bit in the data mask is set. The act of examining all of the bits in the decoded data field is performed in parallel.

Figure 4B:
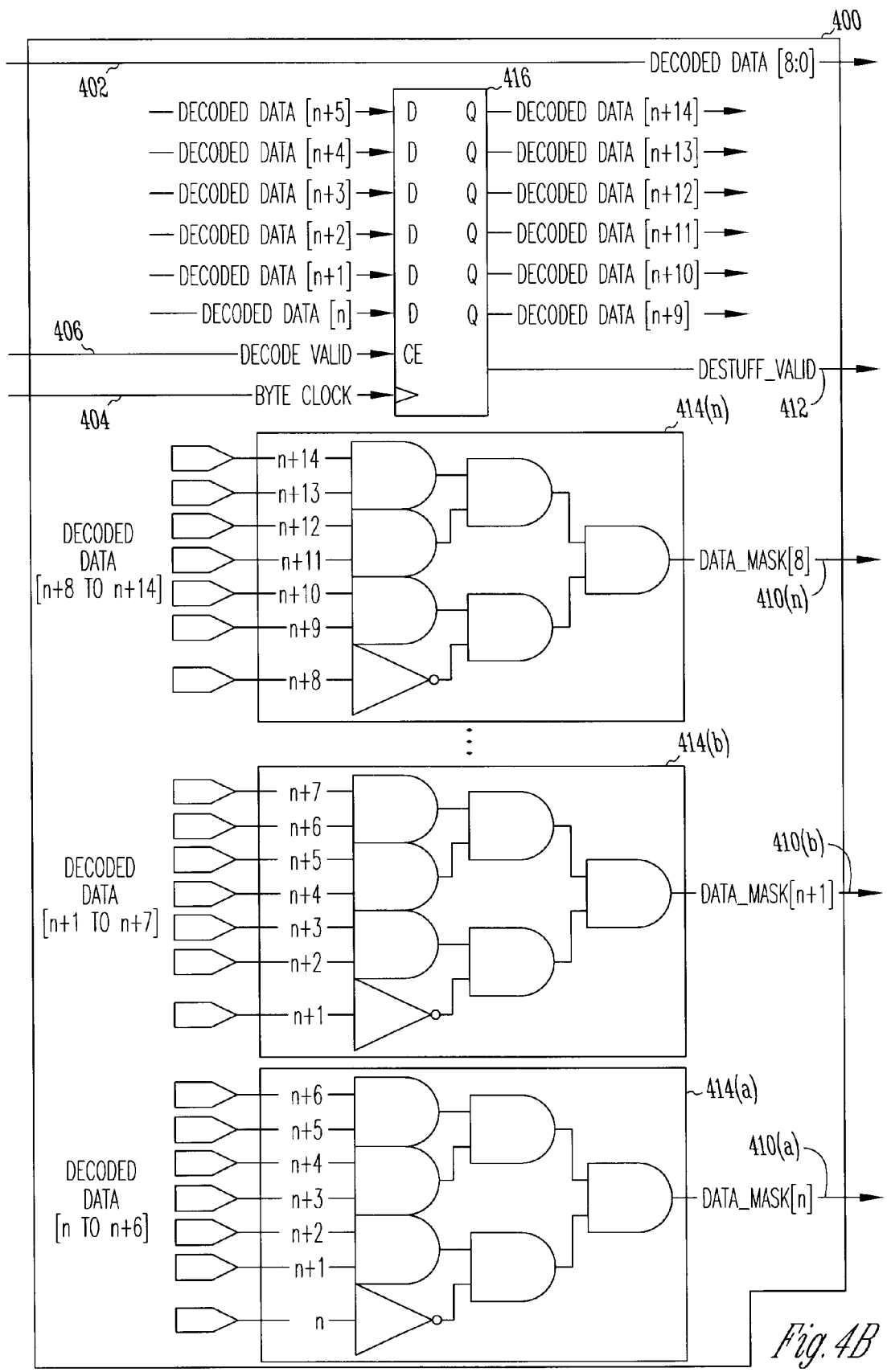
FIG. 4B is a more detailed block diagram of an example embodiment of the parallel stream bit destuffer module shown in FIG. 4A

FIG. 4B is a more detailed block diagram of an example embodiment of the parallel stream bit destuffer module 400 in FIG. 4A. The parallel stream bit destuffer module shown in FIG. 4B comprises a plurality of AND logic blocks 414(a), 414(b), . . . 414(n) and a D-flip flop 416. For each bit in an example nine-bit decoded data field 402, the parallel stream bit destuffer module 400 examines the preceding six bits in a received data stream. If each one of the six preceding bits represents a value of one and the current bit represents a value of zero, then the current bit is a stuffed bit. The mask bit associated with the current bit is set to a one to identify the current bit as a stuffed bit that should be removed from the received data stream.

The AND logic blocks 414(a), 414(b), 414(n) are used to determine if a current bit is a stuffed bit. In the example shown in FIG. 4B, the most recently received bit in a serial data stream is bit n (the "current bit"). To determine if bit n is a stuffed bit, the six previously received consecutive bits in the data stream are examined (bit n+1, bit n+2, bit n+3, bit n+4, bit n+5, and bit n+6). The AND logic block 414(a) in FIG. 4B is an example embodiment of a logic structure to determine if a bit in the decoded data field is a stuffed bit. The AND logic block 414(a) examines the current bit (bit n) and the six previously received consecutive bits in the data stream (bit n+1, bit n+2, bit n+3, bit n+4, bit n+5, and bit n+6). If any of the six previous bits represents the value of a logic zero, then the output of the AND logic block 414(a) is a logic zero which indicates that the current bit (bit n) is a valid data bit. A "valid data bit" is a bit that is not a stuffed bit, i.e. a valid bit was not inserted into the data stream by a transmitter to force a transition. If each one of the six previous bits represents the value of a logic one and if the current bit (bit n) represents the value of a logic zero, then the output of the AND logic block 414(a) is a logic one which indicates that the current (bit n) is a stuffed bit.

In one embodiment, the decoded data is examined in nine-bit fields. The six-bit sliding window for each one of the bits in the nine-bit decoded data field 402 includes the six consecutive bits immediately preceding the bit in the nine-bit decoded data field 402. As each nine-bit decoded data field is received by the parallel stream bit destuffer module 400, each one of the nine parallel AND logic blocks 414(a), 414(b), 414(n) examines the preceding six consecutive decoded data bits for one of the bits in the decoded data field. If the preceding six bits are all logic ones and the current bit being examined is a logic zero, then a mask bit for that position is set to a one. A mask bit set to one indicates that the corresponding bit in the decoded data field 402 is a stuffed bit that is to be removed by the data separator module 304 of FIG. 3.

Because all nine AND logic blocks 414(a), 414(b), 414(n) execute in parallel, the nine output mask bits are available within one byte clock period and the operation is repeated for the next decoded data field 402 during the next clock period. Because each bit that is being examined for stuffing is dependent on the six prior bits, the AND logic block for each bit position performs a logic AND with the prior six bits. In order to analyze the initial six bits in the decoded data field, the last six bits received on the prior clock (and thus in the prior decoded data field) are needed. The last six bits received on the prior clock are stored with the D-Flip Flop 416.

The following equations are for the example embodiment of the parallel stream bit destuffer module 400 shown in FIG. 4B. In this example, bit position n is the final bit in a nine-bit data field received during a clock period. Bit n+1 is the bit received immediately before bit n in the nine-bit data field, bit n+2 is the bit received immediately before bit n+1 in the nine-bit data field, and so on. During any given clock period nine bits are received (bit n to bit n+8); however, a total of 15 bits (bit n to bit n+14) are provided as inputs to the AND logic blocks. The last six bits (bit n+9 to bit n+14) from the prior clock period are stored in the D Flip-flop 416.

For example, the equation for the example AND logic block 414(a) is listed below:

data_mask($n$)<=(not(decoded_data($n$)) and decoded_data($n$+1) and decoded_data($n$+2) and decoded_data($n$+3) and decoded_data($n$+4) and decoded_data($n$+5) and decoded_data($n$+6))

In the equation above for the example logic block 414(a), a value of a mask bit (data_mask (n)) corresponding to a last bit received in the nine-bit data field (decoded_data(n)) is determined using the last bit and the six preceding bits in the nine-bit data field (decoded_data(n+1) through decoded_data(n+6)).

The equation for the example AND logic block 414(b) is listed below:

data_mask(n+1)<=(not(decoded_data($n$+1)) and decoded_data($n$+2) and decoded_data($n$+3) and decoded_data($n$+4) and decoded_data($n$+5) and decoded_data($n$+6) and decoded_data($n$+7))

In the equation above for the example logic block 414(b), a value of a second mask bit (data mask (n+1)) for the second to the last bit received in the nine-bit data field (decoded_data(n+1)) is determined using the second to the last bit and the six preceding bits in the nine-bit data field (decoded_data(n+2) through decoded data(n+7)).

The equation for the example AND logic block 414(n) is listed below:

data_mask(8)<=(not(decoded_data(n+8)) and decoded_data(n+9) and decoded_data(n+10) and decoded_data(n+11) and decoded_data(n+12) and decoded_data(n+13) and decoded_data(n+14))

In the equation above for the example logic block 414(n), a value of a final mask bit (data_mask (n+8)) associated with the first bit received in the nine-bit data field (decoded_data(n+8)) is determined using the first bit and the six preceding bits in the previous nine-bit data field (decoded_data(n+9) through decoded_data(n+14)). The six preceding bits in the received data stream are from the prior nine-bit decoded data field. The value of each one of the six preceding bits is received from a Q output of the D Flip flop 416. Furthermore, the values of the last six bits in the current nine-bit data field are applied to the D inputs of the D flip-flop 416 for use during the next byte clock.

The output from the destuffer module is the destuff valid signal 412, the nine-bit decoded data field 402 and the corresponding nine bits of a mask to identify one or more stuffed bits in the decoded data field. The output of the destuffer module (block 302 of FIG. 3) is presented to a data separator module (block 304 of FIG. 3) as a nine-bit wide data field and a corresponding nine-bit mask running at a 60 MHz rate. The data separator module is described in more detail in the next section.

Removing Stuffed Bits

Figure 5A:
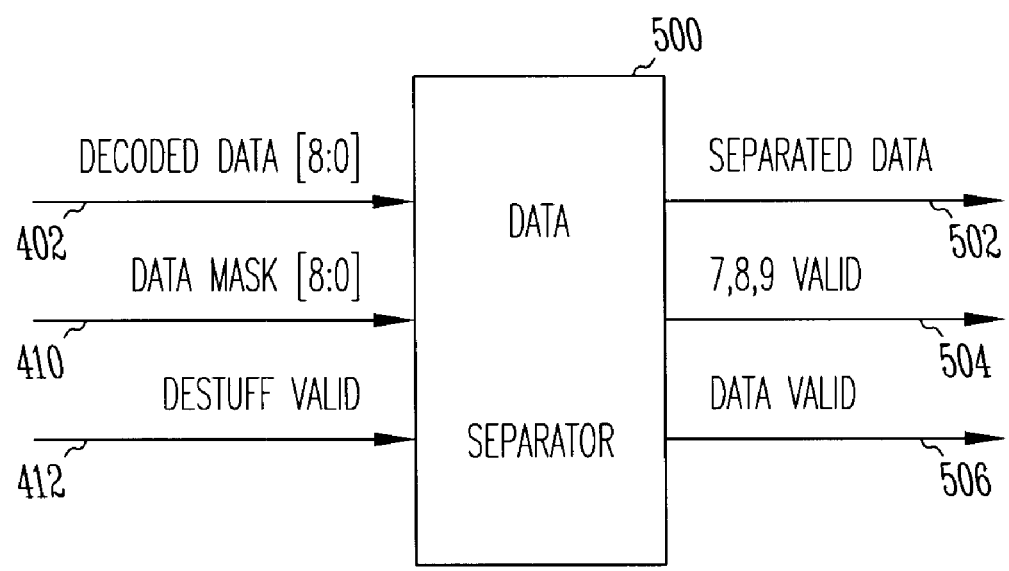
FIG. 5A is a block diagram of an example embodiment of the data separator module of the transceiver shown in FIG. 3.

FIG. 5A is a block diagram of an example embodiment of the data separator module of the transceiver shown in FIG. 3. The inputs to the data separator module 500 comprise the nine-bit field of decoded data 402 from the destuffer module, the nine-bit data mask 410 from the destuffer module, and the destuff valid signal 412 from the destuffer module. The outputs of the data separator module 500 comprise a nine-bit field of decoded data in which the plurality of valid data bits are separated from the stuffed bits 502 (also referred to as "separated data"), a bit 7–8–9 valid indicator 504, and a data valid signal 506

Incoming USB data from the destuffer module is presented to the data separator module 500 as a nine-bit decoded data field 402, a corresponding nine-bit mask 410 and a decode valid signal 412. According to an example embodiment of the invention, a method of removing the stuffed bits from the decoded data field 402 comprises compacting the valid decoded data bits into the lowest bit positions in the nine-bit decoded data field. In one embodiment, compacting the valid decoded data bits is performed by changing a position of one or more of the plurality of valid decoded data bits and/or one or more of the stuffed data bits in the nine-bit decoded data field. The method of removing the stuffed bits also comprises determining the width of the valid decoded data bits based on the number of set bits in the bit mask.

Figure 5B:
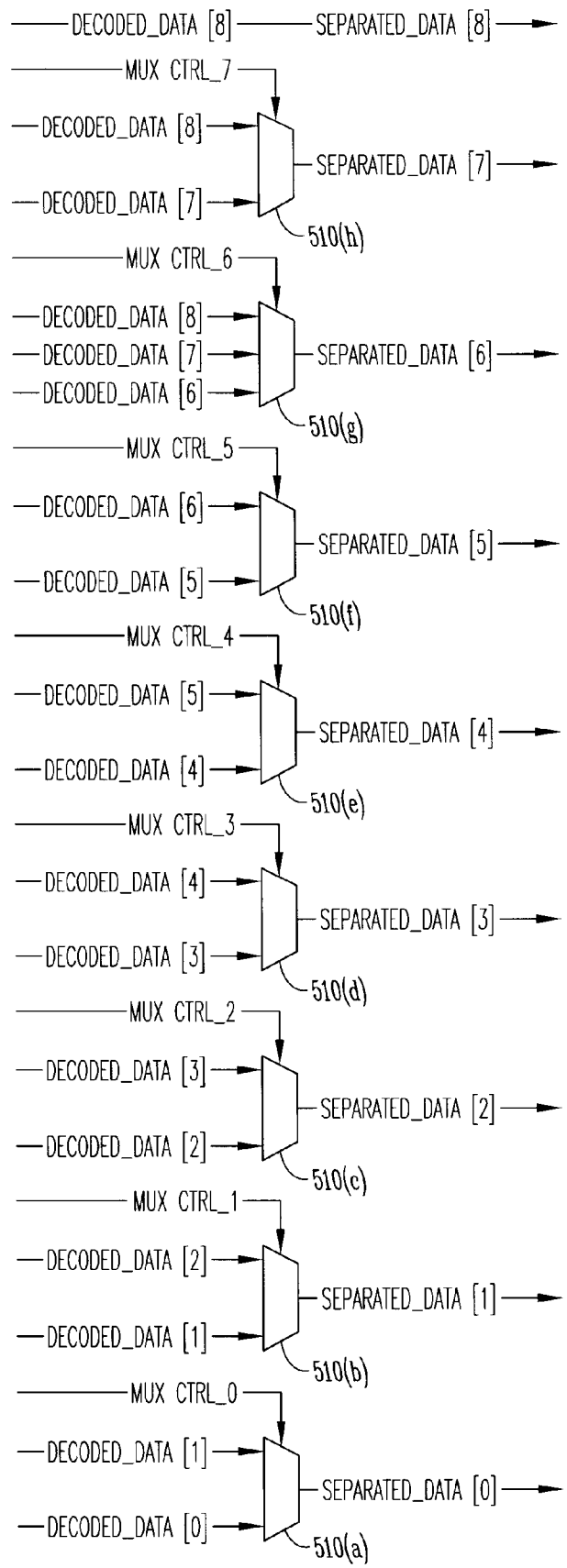
FIG. 5B is a more detailed block diagram of an example embodiment of the data separator module shown in FIG. 5A

FIG. 5B is a more detailed block diagram of an example embodiment of the data separator module shown in FIG. 5A.

In the example embodiment shown in FIG. 5B, a plurality of multiplexors is used to remove the stuffed bits from the decoded data. In the example embodiment, the data separator module uses the incoming data mask values to determine if an incoming decoded data bit is a valid bit or a stuffed bit. If the incoming data bit is a valid bit, then the incoming bit is included with the valid data bits. If the incoming data bit is a stuffed bit, then the incoming data bit is separated from the valid data bits.

In an example embodiment, eight multiplexors 510(a), 510(b), 510(c), 510(d), 510(e), 510(f), 510(g), 510(h), are used to separate the valid data bits from the stuffed bits in the nine-bit decoded data field. Each one of the multiplexors selects one of the nine bits in the decoded data field to be connected to an output bit representing a bit in the nine-bit separated data field 502. In an example embodiment, the manner in which the input bit is connected to each output bit has the effect of changing the position of the valid data bits so that the valid data bits are compacted into the lowest positions in the nine-bit separated data field. Likewise, if one or two stuffed data bits are present, the position of the stuffed bits is changed so that the stuffed bits are compacted into the highest bit positions in the nine-bit separated data field. In other words, the valid data bits are separated from the stuffed data bits in the nine-bit separated data field.

As will be explained in more detail with respect to Table 1 below, at most only two bits in a nine-bit decoded data field are stuffed bits. If the decoded data field includes two stuffed bits, there are six valid bits between the two stuffed bits. Therefore, if the result of the OR operation in the following pseudo code examples indicates that a one is present in one of the mask bits (i.e. a stuffed bit is present in the decoded data field), then the position of one or more of the valid bits is changed using one of the multiplexors.

The operation of the multiplexors shown in FIG. 5B is described by a series of pseudo code examples below. A first multiplexor 510(a) selects a first bit (separated_data[0]) in a nine-bit separated data field. The first multiplexor 510(a) selects either the bit representing decoded_data[0] or the bit representing decoded_data[1]. If the mask bit associated with the bit representing decoded_data[0] represents the value of one, then the bit representing decoded data[0] is a stuffed bit and the next bit (decoded_data[1]) is selected as the first bit (separated_data[0]) in the nine-bit separated data field. Alternatively, if the mask bit represents the value of zero, then the bit representing decoded_data[0] is a valid bit and is selected as the first bit (separated_data[0]) in the nine-bit separated data field. Example pseudo code for the operation of the first multiplexor 510(a) of FIG. 5B is shown below:

```
/*Pseudo Code for Separated_Data[0]*/
IF(mask[0]=TRUE) THEN
{
    separated_data[0] = decoded_data[1]
ELSE
    separated_data[0] = decoded_data[0]
END IF
}
```

A second multiplexor 510(b) selects a second bit (separated_data[1]) in the nine-bit separated data field. The second multiplexor 510(b) selects the input bit representing decoded_data[1] or the input bit representing decoded_data[2]. If either the mask[0] bit or the mask[1] bit represents the value of one, then a stuffed bit is present in one of the corresponding bits in the decoded data field and decoded_data[2] is selected as the second bit (separated_data[1]) in the nine-bit separated data field. Alternatively, decoded_data[1] is selected as the second bit (separated_data[1]) in the nine-bit separated data field.

Example pseudo code for the operation of the second multiplexor 510(*b*) of FIG. 5B is shown below:

```
/*Pseudo Code for Separated_Data[1]*/
IF(mask[0] OR mask[1]=TRUE) THEN
{
    separated_data[1] = decoded_data[2]
ELSE
    separated_data[1] = decoded_data[1]
END IF
}
```

A third multiplexor 510(*c*) selects a third bit (separated-data[2]) in the nine-bit separated data field. The third multiplexor 510(*c*) selects the input bit representing decoded_data[2] or the input bit representing decoded_data[3]. If either the mask[0] bit, the mask[1] bit or the mask[2] bit represents the value of one, then a stuffed bit is present in one of the corresponding bits in the decoded data field and decoded data[3] is selected as the third bit (separated data [2]) in the nine-bit separated data field. Alternatively, decoded_data[2] is selected as the third bit (separated-data [2]) in the nine-bit separated data field. Example pseudo code for the operation of the third multiplexor 510(*c*) of FIG. 5B is shown below:

```
/*Pseudo Code for Separated_Data[2]*/
IF(mask[0] OR mask[1] OR mask[2]=TRUE) THEN
{
    separated_data[2] = decoded_data[3]
ELSE
    separated_data[2] = decoded_data[2]
END IF
}
```

A fourth multiplexor 510(*d*) selects a fourth bit (separated_data[3]) in the nine-bit separated data field. The fourth multiplexor 510(*d*) selects the input bit representing decoded_data[3] or the input bit representing decoded_data[4]. If either the mask[0] bit, the mask[1] bit, the mask[2] bit or the mask[3] bit represents the value of one, then a stuffed bit is present in one of the corresponding bits and decoded_data[4] is selected as the fourth bit (separated_data[3]) in the nine-bit separated data field. Alternatively, decoded_data[3] is selected as the fourth bit (separated_data[3]) in the nine-bit separated data field. Example pseudo code for the operation of the fourth multiplexor 510(*d*) of FIG. 5B is shown below:

```
/*Pseudo Code for Separated_Data[3]*/
IF(mask[0] OR mask[1] OR mask[2] OR mask[3]=TRUE) THEN
{
    separated_data[3] = decoded_data[4]
ELSE
    separated_data[3] = decoded_data[3]
END IF
}
```

A fifth multiplexor 510(*e*) selects a fifth bit (separated_data[4]) in the nine-bit separated data field. The fifth multiplexor 510(*e*) selects the input bit representing decoded_data[4] or the input bit representing decoded_data[5]. If either the mask[0] bit, the mask[1] bit, the mask[2] bit, the mask[3] bit or the mask[4] bit represents the value of one, then a stuffed bit is present in one of the corresponding bits and decoded_data[5] is selected as the fifth bit (separated_data[4]) in the nine-bit separated data field. Alternatively, decoded_data[4] is selected as the fifth bit (separated_data [4]) in the nine-bit separated data field. Example pseudo code for the operation of the fifth multiplexor 510(*e*) of FIG. 5B is shown below:

```
/*Pseudo Code for Separated_Data[4]*/
IF(mask[0] OR mask[1] OR mask[2] OR mask[3] OR mask[4]=TRUE) THEN
{
    separated_data[4] = decoded_data[5]
ELSE
    separated_data[4] = decoded_data[4]
END IF
}
```

A sixth multiplexor 510(*f*) selects a sixth bit (separated_data[5]) in the nine-bit separated data field. The sixth multiplexor 510(*f*) selects the input bit representing decoded_data[5] or the input bit representing decoded_data[6]. If either the mask[0] bit, the mask[1] bit, the mask[2] bit, the mask[3] bit, the mask[4]bit, or the mask[5] bit represents the value of one, then a stuffed bit is present in one of the corresponding bits and decoded data[6] is selected as the sixth bit (separated_data[5]) in the nine-bit separated data field. Alternatively, decoded_data[5] is selected as the sixth bit (separated_data[5]) in the nine-bit separated data field. Example pseudo code for the operation of the sixth multiplexor 510(*f*) of FIG. 5B is shown below:

```
/*Pseudo Code for Separated_Data[5]*/
IF(mask[0] OR mask[1] OR mask[2] OR
mask[3] OR mask[4] OR mask[5]=TRUE) THEN
{
    separated_data[5] = decoded_data[6]
ELSE
    separated_data[5] = decoded_data[5]
END IF
}
```

A seventh multiplexor 510(*g*) selects a seventh bit (separated_data[6]) in the nine-bit separated data field. The seventh multiplexor 510(*g*) selects an output from three inputs. In contrast, the other multiplexors shown in FIG. 5B are two input multiplexors 510(*a*)-510(*f*), 510(*h*).

As can be seen by reference to Table 1 below, at most only two bits are stuffed bits in the nine-bit decoded data field. If the decoded data field includes two stuffed bits, there are six valid bits between the two stuffed bits. Therefore, the first seven bits of the decoded data field contain at most one stuffed bit. However, the last two bits of the decoded data field may contain a second stuffed bit.

The seventh multiplexor 510(*g*) selects the input bit representing decoded_data[6] or the input bit representing decoded_data[7] or the input bit representing decoded_data[8]. If either the mask[0] bit, the mask[1] bit, the mask[2] bit, the mask[3] bit, the mask[4] bit, the mask[5] bit or the mask[6] bit represents the value of one, then the value of the mask[7] bit is used to determine which input is selected. If the mask[7] bit represents the value of one (i.e. there are two stuffed bits in the first eight bits), then the bit representing decoded_data[7] is a stuffed bit and decoded_data[8] is selected as the seventh bit (separated_data[6]) in the nine-bit separated data field. Alternatively, if the mask[7] bit represents the value of zero (i.e. there is one stuffed bit in the first eight bits), then the bit representing decoded data[7] is a valid bit and decoded_data[7] is selected as the seventh bit (separated_data[6]) in the nine-bit separated data field. Otherwise none of the first eight bits in the decoded data field are stuffed bits and decoded_data[6] is selected as the seventh bit (separated_data[6]) in the nine-bit separated data field. Example pseudo code for the operation of the seventh multiplexor 510(g) of FIG. 5B is shown below:

```
/*Pseudo Code for Separated_Data[6]*/
IF(mask[0] OR mask[1] OR mask[2] OR mask[3] OR mask[4] OR
mask[5] OR mask[6]=TRUE) THEN
{
    If(mask[7]=TRUE
        separated_data[6] = decoded_data[8]
    ELSE
        separated_data[6] = decoded_data[8]
    END IF;
ELSE
    separated_data[7] = decoded_data[7]
END IF
```

An eighth multiplexor 510(h) selects an eighth bit (separated_data[7]) in the nine-bit separated data field. The eighth multiplexor 510(h) selects the input bit representing decoded_data[7] or the input bit representing decoded-data [8]. If either the mask[0] bit, the mask[1] bit, the mask[2] bit, the mask[3] bit, the mask[4]bit, the mask[5] bit, the mask[6] bit, or the mask[7] bit represents the value of one, then decoded_data[8] is selected as the eighth bit (separated_data[7]) in the nine-bit separated data field. Alternatively, decoded_data[7] is selected as the eighth bit (separated_data[7]) in the nine-bit separated data field. Example pseudo code for the operation of the eighth multiplexor 510(h) of FIG. 5B is shown below:

```
/*Pseudo Code for Separated_Data[7]*/
IF(mask[0] OR mask[1] OR mask[2] OR mask[3] OR mask[4] OR
mask[5] OR mask[6] OR mask[7]=TRUE) THEN
{
    separated_data[7] = decoded_data[8]
ELSE
    separated_data[7] = decoded_data[7]
END IF
}
```

Although nine bits of decoded data are received during each clock period in an example embodiment of the invention, there are only eight multiplexors in the example embodiment shown in FIG. 5B. The ninth decoded data bit (bit n+8) does not require a multiplexor because either this bit will be used either "as is" if it is a valid bit or this bit will be discarded if it is a stuffed bit.

The data separator module shown in FIG. 5B uses the incoming data mask values to separate the one or more stuffed bits from the plurality of valid data bits in a nine-bit field of decoded data. In an example embodiment, the data separator module also uses the incoming data mask values to determine the width of the valid bits in the separated data field. The data separator module for removing the stuffed bits recognizes the USB data stuffing rule that at most two bits per nine-bit data field can be marked for removal. The data separator module 500 compresses the nine-bit decoded data field 402 by removing any previously stuffed bits identified by the data mask 410. According to the rule that the maximum number of stuffed bits in a nine-bit decoded data field is two, there are twelve possible states for the nine-bit mask of the example embodiment.

The twelve possible states for the nine-bit data mask are shown in Table 1 below. As shown in Table 1, each row contains possible values for one of the bits in the nine-bit data mask. Each column shows a possible state for the nine-bit data mask. For example, a first state for the data mask is shown in column 1. In the first state, each one of the bits in the nine-bit data mask has the value of zero. The first state for the mask bits indicates that all of the bits in the decoded data field are valid bits because none of the mask bits are set to one. If all of the bits in the data mask field are zero, then the width of valid bits in the separated data field is nine bits as indicated in Table 1 by the variable W.

TABLE 1

Possible States for an Example Nine-Bit Data Mask

| | State # Output Width of the Valid Decoded Data Field (W) | | | | | | | | | | | |
|---|---|---|---|---|---|---|---|---|---|---|---|---|
| Mask Bit | #1 W = 9 | #2 W = 8 | #3 W = 8 | #4 W = 8 | #5 W = 8 | #6 W = 8 | #7 W = 8 | #8 W = 8 | #9 W = 8 | #10 W = 8 | #11 W = 7 | #12 W = 7 |
| 8 | 0 | 0 | 0 | 0 | 0 | 0 | 0 | 0 | 0 | 1 | 0 | 1 |
| 7 | 0 | 0 | 0 | 0 | 0 | 0 | 0 | 0 | 1 | 0 | 1 | 0 |
| 6 | 0 | 0 | 0 | 0 | 0 | 0 | 0 | 1 | 0 | 0 | 0 | 0 |
| 5 | 0 | 0 | 0 | 0 | 0 | 0 | 1 | 0 | 0 | 0 | 0 | 0 |
| 4 | 0 | 0 | 0 | 0 | 0 | 1 | 0 | 0 | 0 | 0 | 0 | 0 |
| 3 | 0 | 0 | 0 | 0 | 1 | 0 | 0 | 0 | 0 | 0 | 0 | 0 |
| 2 | 0 | 0 | 0 | 1 | 0 | 0 | 0 | 0 | 0 | 0 | 0 | 0 |
| 1 | 0 | 0 | 1 | 0 | 0 | 0 | 0 | 0 | 0 | 0 | 0 | 1 |
| 0 | 0 | 1 | 0 | 0 | 0 | 0 | 0 | 0 | 0 | 0 | 1 | 0 |

A second state for the data mask is shown above in column 2 of Table 1. In the second state, eight of the bits in the nine-bit data mask have the value of zero. However, one of the bits in the nine-bit data mask (in this case bit 0 of the data mask) represents the value of 1. The second state for the mask bits indicates that one of the bits in the decoded data field is a stuffed bit (in this case bit 0). If one of the bits in the decoded data field is a stuffed bit, then the width of the valid bits in the separated data field is 8 bits as indicated in column 2 of Table 1 by the variable W.

Similarly, the width of valid bits in the separated data field is 8 bits for state # 3, state # 4, state # 5, state # 6, state # 7, state # 8, state As shown above in the applicable column of Table 1, each one of states 3, 4, 5, 6, 7, 8, 9 and 10 indicates that one of the bits in the decoded data field is a stuffed bit.

Another example state for the data mask is shown above in column 11 of Table 1. In this example state, only seven of the bits in the nine-bit data mask have the value of zero. As shown in column 11 of Table 1, two of the bits in the nine-bit data mask (mask bit 7 and mask bit 0) have a value of 1. This example state for the mask bits indicates that two of the bits in the decoded data field are stuffed bits (in this case bit 7 and bit 0). If two of the bits in the decoded data field are stuffed bits, the width of valid bits in the separated data field is 7 bits as indicated in column 11 of Table 1 by the variable W. Similarly, the width of the valid decoded data bit field is 7 bits for state # 12 as shown in Table 1.

Table 2 summarizes the number of stuffed bits and the width of the valid bits in the separated data field for each of the states shown in Table 1 and described above. As described above, by counting the number of logic one's in the nine-bit mask, the number of stuffed bits can be determined. In other words, the number of valid decoded data bits in a nine-bit field can be determined from the number of stuffed bits in the field.

TABLE 2

Number of Stuffed Bits for Each State Shown in the Table 1

| State # | Number Stuffed Bits | Width |
|---|---|---|
| 1 | Zero stuffed bits | 9 |
| 2 | One stuffed bit | 8 |
| 3 | One stuffed bit | 8 |
| 4 | One stuffed bit | 8 |
| 5 | One stuffed bit | 8 |
| 6 | One stuffed bit | 8 |
| 7 | One stuffed bit | 8 |
| 8 | One stuffed bit | 8 |
| 9 | One stuffed bit | 8 |
| 10 | One stuffed bit | 8 |
| 11 | Two stuffed bits | 7 |
| 12 | Two stuffed bits | 7 |

When separating one or more stuffed bits from a plurality of valid data bits, the width of the valid bits in the separated data field is calculated by using the "IF" statements shown below. In one embodiment, the number of one bits in the data mask is used to determine the width. If zero data mask bits are set the width is 9. If one data mask bit is set then the width is 8 and if two data mask bits are set the width is 7. The pseudo code below illustrates that if the number of stuffed bits is 2, then the width of the valid decoded data field is 7. Likewise, if the number of stuffed bits is 1, then the width of the valid decoded data field is 8 and if the number of stuffed bits is 0, then the width of the valid decoded data field is 9.

If (number of set mask bits=2)
   Width=7
Else if (number of set mask bits=1)
   Width=8
Else
   Width=9
End if As described above, the output from the data separator module is a nine-bit field of decoded data in which the plurality of valid data bits are separated from the stuffed bits (also referred to as "separated decoded data"), a bit 7–8–9 valid indicator, and a data valid signal. The output of the data separator module (block 304 of FIG. 3) is presented to a memory module (block 306 of FIG. 3). The memory module is described in more detail in the next section.

Writing Valid Bits to a Memory Structure

After the valid bits and the stuffed bits are separated in the decoded data field, the complete nine-bit separated data field is written to a memory structure. However, the number of valid bits in each one of the nine-bit decoded data fields varies. As described above by reference to Table 1 and Table 2, the number of valid bits within each decoded data field is either seven, eight or nine. Therefore, an example embodiment of the present invention includes a bit-wise memory buffer that allows variable-width data to be written and also allows byte-wide data to be read out. In a memory buffer design like this, the data arrival rate could overrun the outgoing rate by up to 12.5% (⅛) or under run the outgoing rate by 12.5% (⅛). The bit-wise memory buffer described below provides elasticity for absorbing such rate differences. The peripheral side of the USB 2.0 peripheral macrocell reads an integral multiple of 8 bits unless an error condition exists. In a system where the transmitter and receiver clocks are matched in frequency, the peripheral interface will never be starved or overrun with data and the read pointer logic will increment through memory until the last byte is retrieved.

Figure 6A:
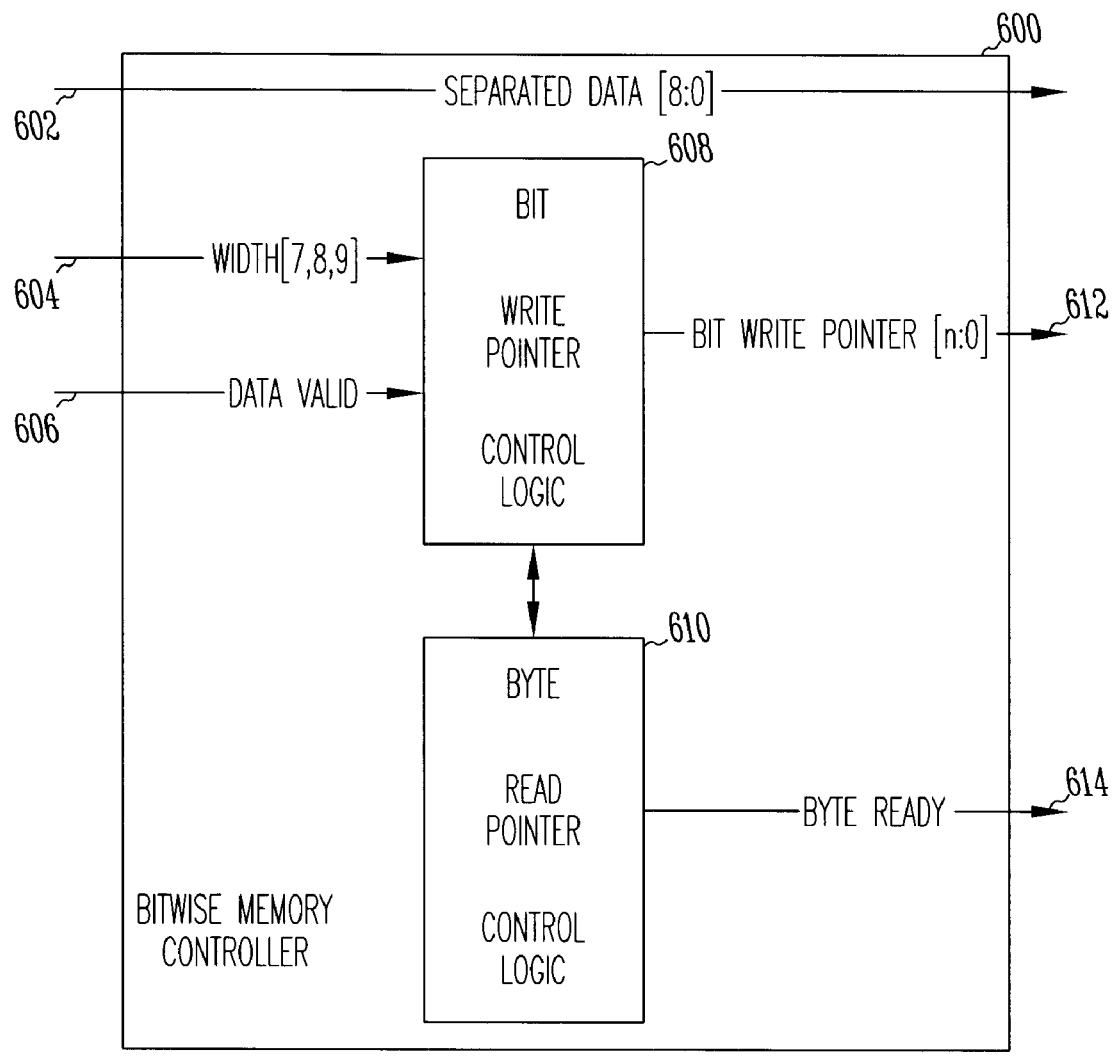
FIG. 6A is a block diagram of a bit-wise memory controller according to an example embodiment of the invention.

FIG. 6A is a block diagram of a bit-wise memory controller 600 according to an example embodiment of the invention. The bit-wise memory controller 600 receives a nine-bit field of separated data 602, a width indicator 604 for the number of valid bits in the separated data, and a data valid signal 606. The bit-wise memory controller 600 comprises bit write pointer control logic 608 and byte read pointer control logic 610. The bit write pointer control logic 608 of the bit-wise memory controller 600 generates a bit write pointer 612. The byte read pointer control logic 610 of the bit-wise memory controller 600 generates a byte ready signal 614.

After one or more stuffed bits are separated from a plurality of valid bits in the nine-bit decoded data field, the nine separated data bits are all available to the memory system but 7, 8 or 9 bits within this data field are valid. The write pointer increment logic 608 is responsible for increasing the memory bit write pointer by a correct number of valid bits and decreasing it by the number of bits that have been consumed. The bit-wise memory controller 600 increments the write pointer by 7, 8 or 9 when the data valid signal is asserted and decrements the write pointer by 8 when 8 bits are available in the memory system. A byte ready signal 614 is used to flow control the consumer USB device connected to this system when less than 8 bits are available. When the byte flag is asserted high 8 bits are available and the attached consumer consumes the entire 8 bits.

Figure 6B:
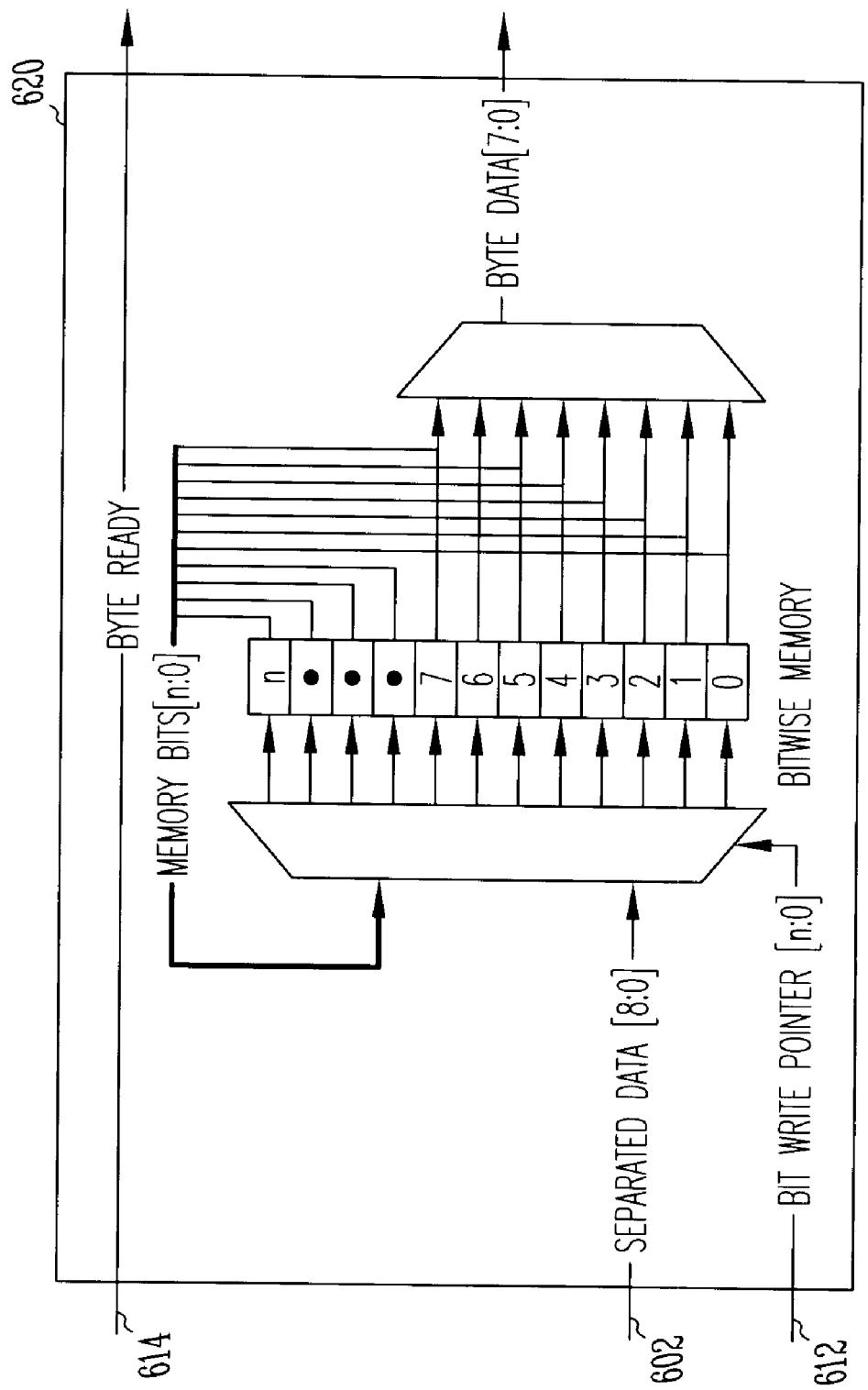
FIG. 6B is a block diagram of a bit-wise memory structure according to an example embodiment of the invention.

FIG. 6B is a block diagram of a bit-wise memory structure 620 according to an example embodiment of the invention. The bit-wise memory uses an n+9 by n-bit multiplexor where n equals the size of the memory in bits. When 7-, 8-or 9-bit data arrives, the bit-wise pointer selects the bit memory locations immediately on top of the currently stored bits. When 8 bits are available for the attached consumer, the bit-wise pointer will be configured to shift the currently stored bits 8 bits lower in memory on the next memory write cycle.

Data Flow Example

Figure 7:
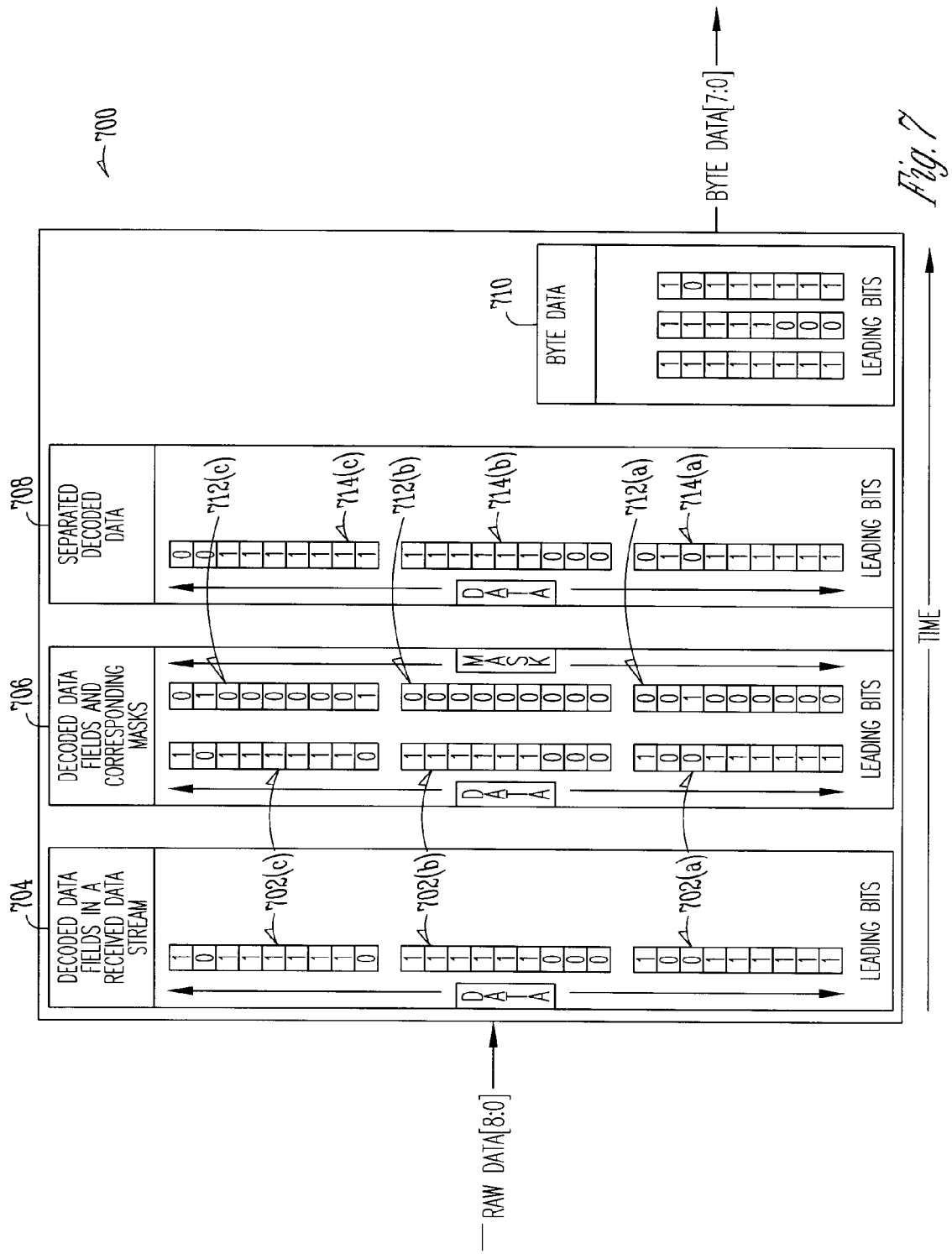
FIG. 7 is a diagram of a received data stream moving through a USB transceiver according to an example embodiment of the invention.

FIG. 7 is a diagram showing three nine-bit fields of data 702(a), 702(b), 702(c) moving through a USB transceiver 700 according to an example embodiment of the invention. FIG. 7 shows example data flowing through the components of the USB transceiver. Raw data flows into the system and is stored in nine-bit fields 702(a), 702(b), 702(c) as shown in a first block 704 of FIG. 7.

In a second block 706 of FIG. 7, one or more stuffed bits are identified in the nine-bit fields 702(a), 702(b), 702(c) of data and a corresponding bit in a mask 712(a), 712(b), 712(c) is set to 1 when the data bit has been stuffed into the data stream. As shown in block 706, the first nine-bit field 702(a) to arrive has one stuffed bit and one mask bit set to indicate that the stuffed bit needs to be removed. The second nine-bit field 702(b) contains no stuffed bits and the mask is set to all 0's to indicate that all nine bits are valid. In the last nine-bit field 702(c) two stuffed bits exist so two mask bits are set to indicate that the two corresponding data bits should be removed.

In a third block 708, the stuffed bits are separated and removed from the valid bits in the nine-bit fields 702(a), 702(b), 702(c) to create separated decoded data fields 714(a), 714(b), 714(c). In the fourth block 710, the data is written into a bit-wise memory buffer. When eight bits have accumulated in the memory buffer, the byte data is pushed to the USB consumer device. When the byte data reaches the USB consumer device all stuffed bits have been removed and the data appears in the same eight-bit form as it did when the data was originally created by the USB originating USB device.

Conclusion

Currently available USB 1.1 peripheral implementations run at a maximum bit rate of 12 Mbps and use a 12 MHz clock to process the incoming data stream using bit-level state machines. When running at bit rates it is possible to assemble bytes on a bit-by-bit basis using the bit clock without incurring any latency penalty.

With this novel approach described herein, an USB 2.0 stream of data can be destuffed, separated (compressed) and written bit-wise into memory using variable-length memory pointer arithmetic. This allows all processing to occur using the byte clock and minimizes the speed and cost associated with implementing USB 2.0 peripherals in an ASIC.

It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A method comprising:
    identifying in parallel one or more stuffed bits in a decoded data field of a received data stream using a six-bit sliding window;
    separating in parallel the one or more stuffed bits from a plurality of valid data bits in the decoded data field; and
    writing the plurality of valid data bits from the decoded data field into a variable sized bit-wise memory structure.

2. The method of claim 1 wherein the six-bit sliding window for a first bit in the decoded data field includes six consecutive bits immediately preceding the first bit in the received data stream.

3. The method of claim 2 wherein identifying one or more stuffed bits further comprises:

examining the first bit in the decoded data field and the six-bit sliding window for the first bit; and
setting a first corresponding bit in a mask, if the six-bit sliding window indicates that the first bit is a stuffed bit.

4. The method of claim 3 wherein identifying one or more stuffed bits further comprises:
    examining a second bit in the decoded data field and a six-bit sliding window for the second bit; and
    setting a second corresponding bit in the mask, if the six-bit sliding window indicates that the second bit is a stuffed bit.

5. The method of claim 4 wherein the act of examining the first bit and the act of examining the second bit are performed during a same clock period.

6. The method of claim 5 wherein the act of examining each one of the bits in the decoded data field is performed in parallel.

7. The method of claim 1 wherein the separating the stuffed bits comprises changing a position of one or more of the plurality of valid decoded data bits in the nine-bit decoded data field.

8. The method of claim 7 further comprising determining a width of the plurality of valid decoded data bits based on the mask.

9. The method of claim 1 wherein writing the plurality of valid data bits is performed with a pointer representing a number of valid bits in the memory structure.

10. The method of claim 9 wherein the pointer is incremented by a number of the valid data bits in the decoded data field.

11. The method of claim 9 further comprising reading the plurality of data bits from the variable bit-wise memory structure in bytes.

12. The method of claim 11 wherein the pointer is decremented by eight when a byte of data is read.

13. An application specific integrated circuit (ASIC) comprising:
    Universal Serial Bus (USB) transceiver logic, the USB transceiver logic to create a mask to identify one or more stuffed bits in a received data stream, to remove the stuffed bits from a plurality of valid data bits in the received data stream, and to write the plurality of valid data bits into a variable sized bit-wise memory structure.

14. The ASIC of claim 13 wherein the transceiver logic to create a mask further comprises logic to examine a bit in a nine-bit data field of the received data stream and six bits preceding the bit in the nine-bit data field and logic to set a corresponding bit in the mask, if the six bits preceding the bit indicate that the bit is stuffed.

15. The ASIC of claim 13 wherein the transceiver logic to remove the stuffed bits further comprises logic to compact the valid data bits into the lowest bit positions in the nine-bit data field.

16. The ASIC of claim 15 wherein the transceiver logic to remove the stuffed bits further comprises logic to determine a width of the valid data bits in the nine-bit data field based on the mask.

17. The ASIC of claim 16 wherein the transceiver logic to write further comprises a pointer representing a number of valid bits in the memory structure.

18. The ASIC of claim 17 wherein the pointer is incremented by a number of the valid data bits in the data field and the pointer is decremented by eight when a byte of data is read.

19. An apparatus comprising:
    device-specific logic for a Universal Serial Bus (USB) peripheral device;

a transceiver to receive signals following a Universal Serial Bus (USB) version 2.0 data communications protocol, the transceiver comprising a parallel stream bit destuffer module to create a mask to dentify stuffed data in a received data stream having stuffed data and valid data, a data separator module to separate the stuffed data from the valid data, and a memory module to store the valid data; and a serial interface engine to provide an interface between the device-specific logic and the transceiver.

20. The apparatus of claim 19 wherein the memory module of the transceiver further comprises a memory buffer to receive variable size data.

21. The apparatus of claim 20 wherein the device-specific logic is for the USB peripheral device selected from the group consisting of a printer, a digital camera, a joystick, a speaker, and a telephone.

22. A Universal Serial Bus transceiver comprising:

means for identifying in parallel one or more stuffed bits in a decoded data field of a received data stream using a sliding window and a mask;

means for separating in parallel the one or more stuffed bits from a plurality of valid data bits in the decoded data field using the mask; and means for writing the plurality of valid data bits from the decoded data field into a variable sized bit-wise memory structure.

23. The Universal Serial Bus transceiver of claim 22 wherein the means for identifying further comprises:

means for examining each bit in the decoded data field and the sliding window for each bit; and means for setting a first corresponding bit in the mask, if the sliding window indicates that one of the bits is a stuffed bit.

24. The Universal Serial Bus transceiver of claim 23 wherein the means for separating further comprises means for changing a position of one or more of the plurality of valid decoded data bits in the nine-bit decoded data field and means for determining a width of the plurality of valid decoded data bits based on the mask.

25. The Universal Serial Bus transceiver of claim 24 wherein the means for writing further comprises means for representing a number of valid bits in the memory structure.

* * * * *